United States Patent [19]
Co et al.

[11] Patent Number: 5,436,939
[45] Date of Patent: Jul. 25, 1995

[54] MULTI-PHASE CLOCK GENERATOR AND MULTIPLIER

[75] Inventors: Ramon S. Co, Milpitas; Ron Kao, San Jose, both of Calif.

[73] Assignee: 3 Com Corporation, Santa Clara, Calif.

[21] Appl. No.: 316,801

[22] Filed: Oct. 3, 1994

Related U.S. Application Data

[63] Continuation of Ser. No. 879,960, May 6, 1992, abandoned.

[51] Int. Cl.$^6$ .............................................. H03D 3/24
[52] U.S. Cl. ..................................... 375/376; 331/57; 331/108 R
[58] Field of Search .................. 375/118, 119, 120; 331/57, 53, 108 R, 18, 25, DIG. 3, 60, 45, 38, 108 B; 307/269; 455/260

[56] References Cited

U.S. PATENT DOCUMENTS

| | | | |
|---|---|---|---|
| 5,059,924 | 10/1991 | JenningsCheck | 331/57 |
| 5,073,905 | 12/1991 | Dapper et al. | 375/106 |
| 5,119,045 | 6/1992 | Sato | 331/57 |
| 5,175,512 | 12/1992 | Self | 331/57 |
| 5,180,994 | 1/1993 | Martin et al. | 331/57 |
| 5,191,301 | 3/1993 | Mullgrav, Jr. | 331/57 |

*Primary Examiner*—Stephen Chin
*Assistant Examiner*—Hai H. Phan
*Attorney, Agent, or Firm*—Benman Collins & Sawyer

[57] ABSTRACT

A multiphase clock generator which exhibits frequency stability in the presence of power supply noise. The clock generator of the present invention includes a phase detector for generating a phase error signal in response to the phase difference between an input signal and a recovered clock signal. A phase-locked feedback loop is operative to synthesize a recovered clock signal in response to the phase error signal. Included within the feedback loop is a differential ring oscillator disposed to provide first and second phase-shifted output signals at first and second output ports. The addition of a combination network to the multiphase clock generator of the present invention allows a multiplied clock signal to be derived from an input signal. Specifically, the phase-locked feedback loop 18 included within the clock multiplier of the present invention provides a plurality of sequentially phase-shifted waveforms at a first multiple of the frequency of the input signal. The phase-shifted waveforms are then combined into the output clock signal at a second multiple of the frequency of the input clock signal.

12 Claims, 6 Drawing Sheets

MULTI-PHASE CLOCK GENERATOR AND MULTIPLIER

This is a continuation of application Ser. No. 07/879,960 filed on May 6, 1992 abandoned.

BACKGROUND OF THE INVENTION

1. Field of the Invention

This invention relates to the electronic generation of periodic waveforms. More specifically, this invention relates to techniques for synthesizing one or more phase-locked output signals in response to an input signal.

While the present invention is described herein with reference to a particular embodiment, it is understood that the invention is not limited thereto. Those having ordinary skill in the art and access to the teachings provided herein will recognize additional embodiments within the scope thereof.

2. Description of the Related Art

In many digital systems a master clock is used to synchronize the operation of the constituent devices within a system. The individual system components may be driven by a clock waveform or multiple thereof or may operate in accordance with control signal information derived therefrom.

Unfortunately, perturbations in the power supplied to a digital system can cause variation in the frequency of the system clock. Such power supply variation can arise, for example, in systems having a plurality of devices in electrical communication with a single power supply. In particular, such "switching noise" created by variation in the power consumed by one of the commonly-energized devices may alter the power delivered to the system clock.

Operation of the system clock may also be adversely affected by undesired extrinsic noise such as voltage spikes and the like inherently present in the energy provided by the power supply itself. This type of noise irregularity may also give rise to timing errors by creating a variation in clock frequency.

Accordingly, a need in the art exists for a multiple-phase clock generator/multiplier substantially immune from internal power supply noise and from the switching noise associated with system components coupled to a common energy source.

SUMMARY OF THE INVENTION

The aforementioned need in the art for a clock generator exhibiting frequency stability in the presence of power supply noise is addressed by the multiphase clock generator of the present invention. The inventive multiphase generator includes a phase detector for generating a phase error signal in response to the phase difference between an input signal and a recovered clock signal. A phase-locked feedback loop is operative to synthesize a recovered clock signal in response to the phase error signal. Included within the feedback loop is a differential ring oscillator disposed to provide first and second phase-shifted output signals at first and second output ports.

The addition of a combination network to the multiphase clock generator of the present invention allows a multiplied clock signal to be derived from an input signal. Specifically, the phase-locked feedback loop included within the clock multiplier of the present invention provides a plurality of sequentially phase-shifted waveforms at a first multiple of the frequency of the input signal. The phase-shifted waveforms are then combined into the output clock signal at a second multiple of the frequency of the input clock signal.

DETAILED DESCRIPTION OF THE INVENTION

Figure 1:
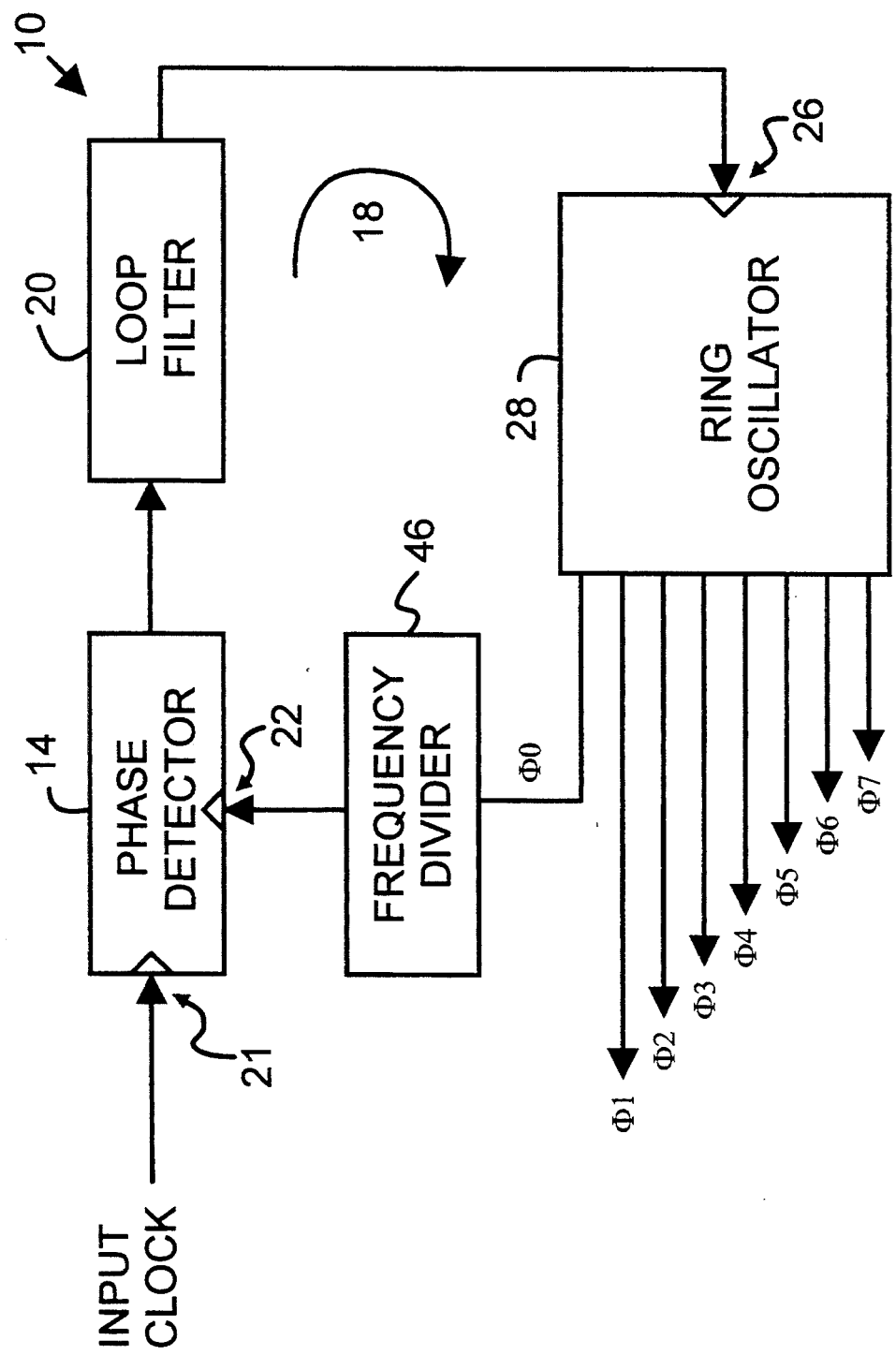
FIG. 1 shows a block diagram of a preferred embodiment of the multiphase clock generator of the present invention.

FIG. 1 shows a block diagram of a preferred embodiment of the multiphase clock generator 10 of the present invention. The generator 10 includes a phase detector 14 in communication with a feedback loop 18. The phase detector 14 provides a phase error signal to a loop filter 20 in response to the phase difference between an input clock signal applied to a first input port 21 and a recovered clock signal incident on a second input port 22. The loop filter 20 generates an analog control voltage predicated on information included within the phase error signal. The control voltage is impressed on a control terminal 26 of a differential ring oscillator 28. The ring oscillator 28 supplies output signals $\phi_0$, $\phi_1$, $\phi_2$, $\phi_3$, $\phi_4$, $\phi_5$, $\phi_6$, and $\phi_7$ equally separated in phase, with output signal $\phi_0$ being supplied to a frequency divider 46. The frequency division effected by the divider 46 transmutes the output signal $\phi_0$ into the recovered clock signal.

As is described below, the output signals supplied by the ring oscillator 28 are staggered in phase and are of a known frequency multiple of the input clock signal. This feature of the present invention allows a single input clock signal to be transformed into a plurality of output signals available for use by, for example, system components requiring separate clock signals.

The phase detector 14 may be conventionally implemented with a zero-crossing phase/frequency detector disposed to provide a phase error signal consisting of a train of weighted pulses. The pulses are each temporally separated by the period of the input clock signal, and each are of a pulse width proportional to the instantaneous phase difference between the input clock signal and the recovered clock signal.

In the preferred embodiment of FIG. 1 the loop filter 20 is realized as an RC network designed to yield a control voltage of an intermediate magnitude relative to the system supply voltage (not shown). Specifically, the loop filter is designed such that for a given supply voltage (e.g. 5V) the control voltage nominally provided to the ring oscillator 28 to engender the desired oscillation frequency will be of a convenient magnitude (e.g., between 1.5 and 2V). The filter 20 may be conventionally fabricated in a semiconductor medium using diffused resistive and capacitive elements.

Figure 2:
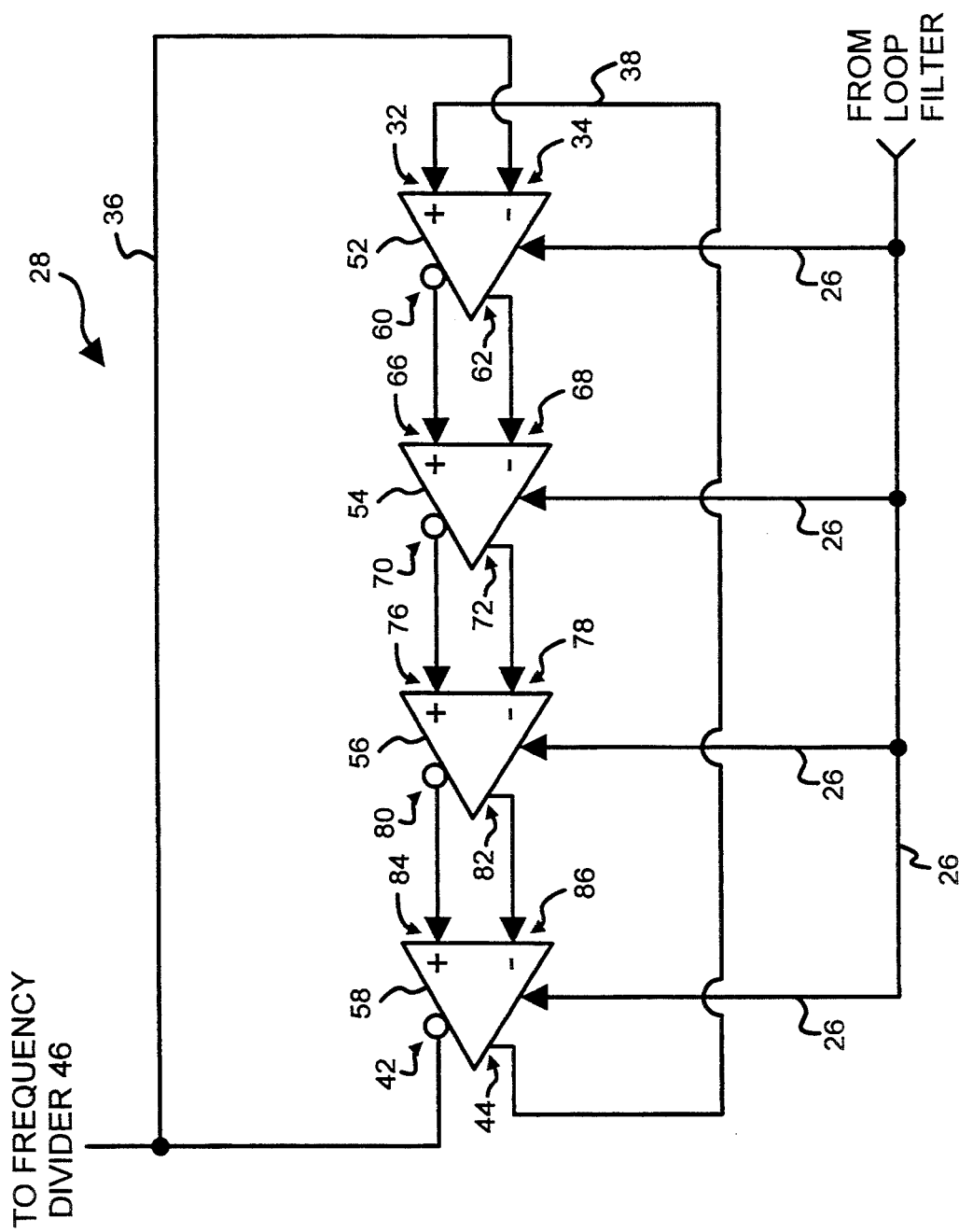
FIG. 2 shows a more detailed illustrative representation of the ring oscillator included within a preferred embodiment of the inventive clock generator.

FIG. 2 shows a more detailed illustrative representation of the ring oscillator 28 included within a preferred embodiment of the present invention. The oscillator 28 includes first, second, third and fourth serially-connected comparator modules 52, 54, 56 and 58. The fourth module 58 provides first and second output ports 42 and 44. The ports 42 and 44 are linked to inverting and non-inverting input terminals 32 and 34 of the first comparator 52 by first and second feedback paths 36 and 38, respectively. The first comparator module 52 includes first inverting and non-inverting output terminals 60 and 62. The interconnecting terminals 60 and 62 are in communication with the second module 54 via the non-inverting and inverting input terminals 66 and 68 thereof. Similarly, second interconnecting inverting and non-inverting output terminals 70 and 72 link the second comparator module 54 with a third set of non-inverting and inverting input terminals 76 and 78 of the third module 56. The third module 56 includes a third set of inverting and non-inverting output terminals 80 and 82 linked to a fourth pair of non-inverting and inverting input terminals 84 and 86.

The differential ring oscillator 28 is operative to provide the aforementioned set of sequentially phase-shifted output signals at the inverting and non-inverting output terminals of the comparator modules 52, 54, 56 and 58. The phase delay through the oscillator 28 is controlled by the feedback action of the loop 18 such that a phase-locked condition is substantially maintained between the recovered clock signal and the input clock. Specifically, the loop control voltage supplied to the comparator modules within the oscillator 28 serves to modify the phase delay through each in order to engender the requisite oscillation frequency. For example, if 40 MHz oscillation is desired within the oscillator 28 in the presence of a 20 MHz input signal, the total delay therethrough for a one-half cycle of 40 MHz will be designed to be 12.5 nanoseconds. If a uniform phase difference is desired between the phase-shifted output signals tapped from the oscillator 28 then each comparator module will be designed to yield a substantially identical phase delay. As may be appreciated from the discussion below relating to FIG. 3, an equivalent phase delay through the comparator modules is effected by including transistor elements of equivalent dimension within each.

Figure 3:
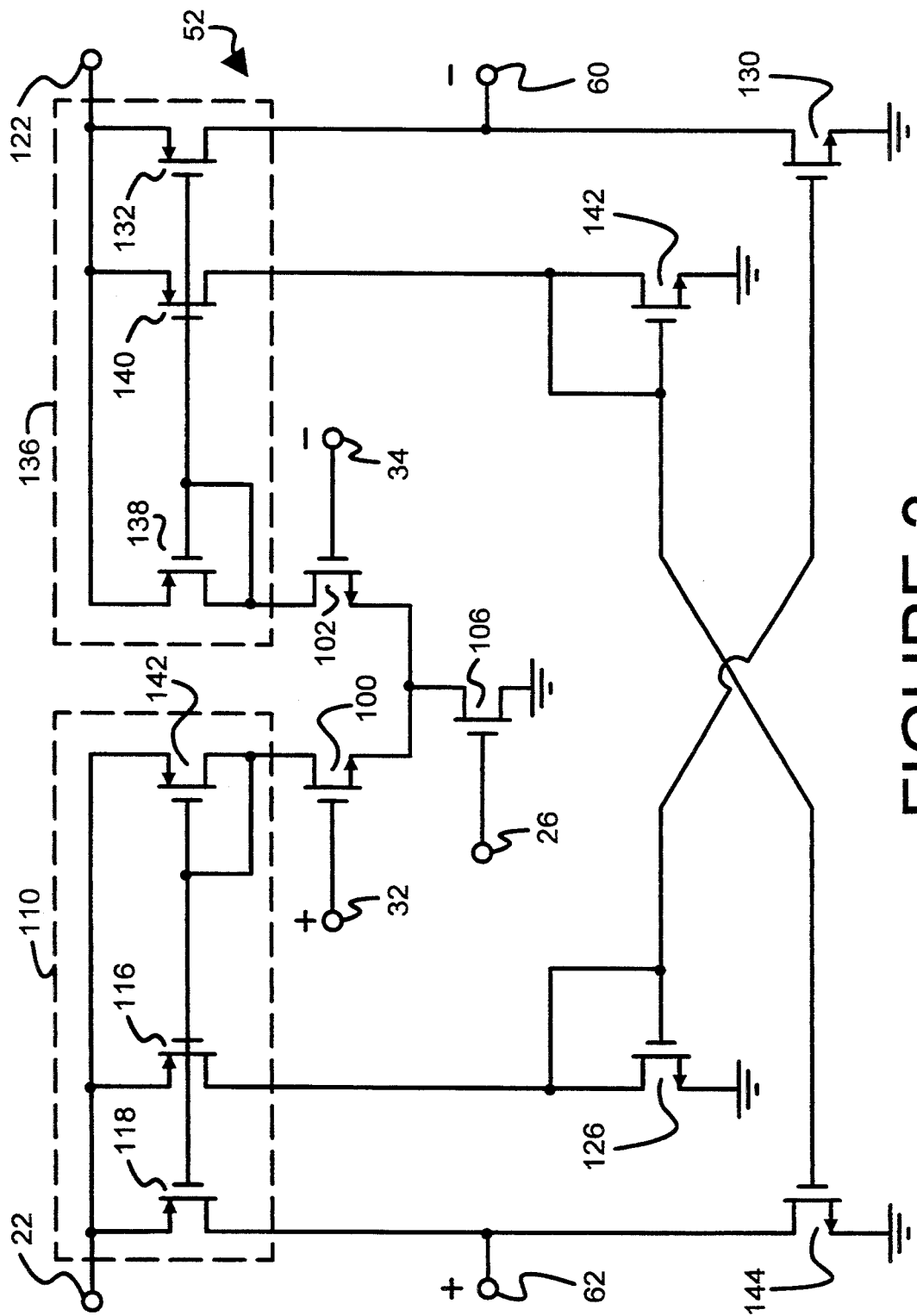
FIG. 3 is a schematic representation of the first differential generator module included within the ring oscillator.

FIG. 3 is a schematic representation of the first differential comparator module 52 included within the ring oscillator 28. In the presently described preferred embodiment each of the comparator modules are substantially identical in both structure and operation so as to effect a uniform phase delay between each of the output signals tapped from the ring oscillator. Moreover, the differential design of each of the comparator modules makes the ring oscillator 28 substantially immune to power supply fluctuations.

As is shown in FIG. 3, the comparator module 52 includes first and second input n-channel field-effect transistors 100 and 102. The gate of the first transistor 100 is held at the voltage impressed on the non-inverting input terminal 32, while the gate voltage of the second transistor is held at the voltage impressed on the inverting terminal 34. The source terminal of each of the transistors 100 and 102 is coupled to the drain of an n-channel control transistor 106. As is indicated by FIG. 3, the current through the pair of input transistors 100 and 102 is determined by the voltage on the gate of the transistor 106. Accordingly, the voltage applied to the control terminal 26 regulates the bias condition of the transistors 100 and 102.

In the absence of a differential input signal, the module 52 operates to divide the current flowing through the control transistor 106 equally between the first and second transistors 100 and 102. Increasing the voltage at the non-inverting input terminal 32 relative to the inverting input terminal 34 results in an increase in current through the first transistor 100, and a commensurate decrease in current through the second transistor 102 proportional to the transconductance of the first and second transistors 100 and 102. A subsequent increase in the current through the first transistor 100 augments the current flow through a current mirror network 110 coupled to the drain of transistor 100.

As shown in FIG. 3, the current mirror network 110 includes a trio of p-channel field-effect transistors 114, 116 and 118. An increase in the current through transistor 100 induces a current increase in transistors 116 and 118 and a concomitant increase in the current through the driver control transistor 126. A contemporaneous decrease in the current through transistor 102 reduces current flow through driver control transistor 142, and also reduces the current through the transistors 140 and 132 included within the current mirror network 136.

As is indicated in FIG. 3, transistors 126 and 130 form a current mirror. In particular, an increase in the current through transistor 126 leads to an increase in the current through transistor 130. The current increase through transistor 130, coupled with the reduction in current through transistor 132 causes the inverting output terminal 60 to be driven low. Transistors 142 and 144 also constitute a current mirror, and consequently a decrease in current through transistor 142 is accompanied by a decrease in the current flowing through transistor 144. Again, the decrease in current through transistor 144 in conjunction with increased current flow through transistor 118 raises the non-inverting output terminal 62.

Similarly, an increase in the voltage at the inverting input terminal 34 relative to that at the terminal 32 engenders a current increase through p-channel transistors 138 and 140 and the transistor 132 included within the current mirror 136. Again, a current increase through transistor 140 augments the current passing through a second n-channel output driver transistor 142. In this way the voltage at the non-inverting terminal 62 is reduced by a second n-channel driver transistor 144 arranged in a common gate configuration with transistor 142.

The foregoing description of the operation of the module 52 reveals that the voltage at the inverting and non-inverting output terminals 60 and 62 varies in response to the presence of a differential signal across the input terminals 32 and 34, and not as a function of perturbations in the voltage present on the supply terminal 122. Accordingly, it is a feature of the present invention that the phase delay through the comparator modules and through the ring oscillator 28 is substantially immune from power supply noise. Rather, the phase delay through each module is determined by the bias current through the input transistors as determined by control transistor 106. In this manner the inventive multiphase generator 10 may be utilized to provide a plurality of non-interfering phase-locked clock waveforms to system components energized by a single power supply.

The dimensions of the transistors within each comparator module are chosen such that the cumulative delay through the oscillator 28 results in the desired oscillation frequency. For example, for a set of sequentially phase-shifted output signals at a frequency of 40 MHz the requisite cumulative phase delay through the ring oscillator will be 12.5 nanoseconds. Thus, for a uniform phase difference between successive output signals the delay through each of the four comparator modules within the ring oscillator 28 will be chosen to be 3.125 nanoseconds. It follows that the loop filter 20 will be designed to provide a control voltage resulting in a 3.125 nanosecond delay through each comparator when the recovered clock and input waveforms are locked in phase. As an additional example, if eight comparator modules are included within the oscillator 28 then the filter 20 will be realized to provide a control voltage which induces a 1.5625 nanosecond delay through each comparator in the phase-locked condition. It is noted that in each of the above examples the divider 46 will operate at a frequency division ratio of two in order to generate a recovered clock waveform identical in frequency to the input waveform.

Figure 4:
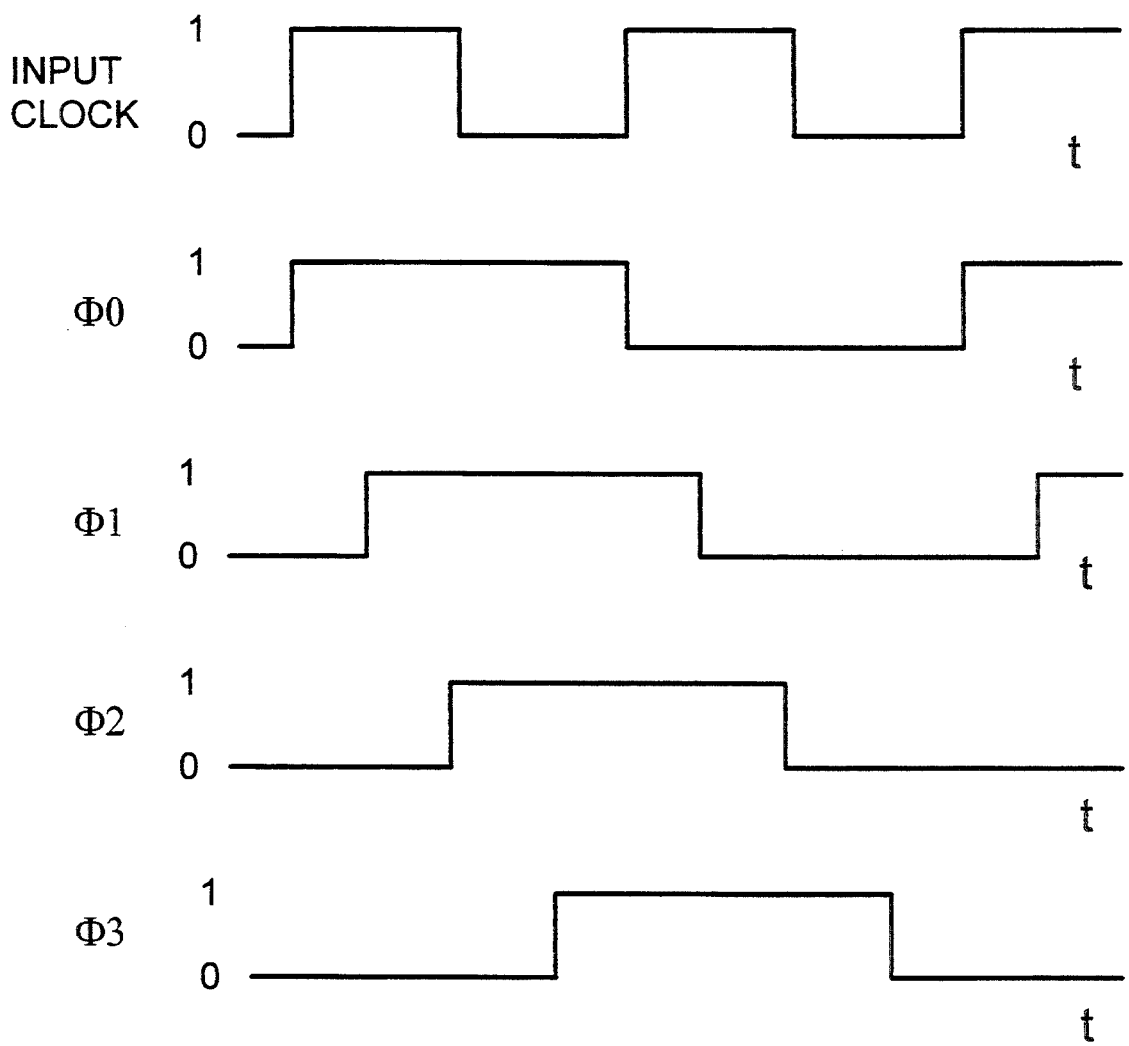
FIG. 4 is a timing diagram illustrating the phase relationship between a set of output signals provided by the inventive clock generator in response to an input clock waveform.

FIG. 4 is a timing diagram illustrating the phase relationship between a set of output signals tapped from the ring oscillator 28 in response to a square input clock waveform. Specifically, the output signal denoted by $\phi_0$ denotes the waveform present on the feedback path 36, while those signals identified as $\phi_1$, $\phi_2$ and $\phi_3$ refer to the waveforms at the output terminals 60, 72 and 80, respectively. As shown in FIG. 4, the frequency of the output signals supplied by the oscillator 28 are twice that of the input clock signal. Again, the phase delay between successive output signals is equivalent to the delay through each phase comparator.

Figure 5:
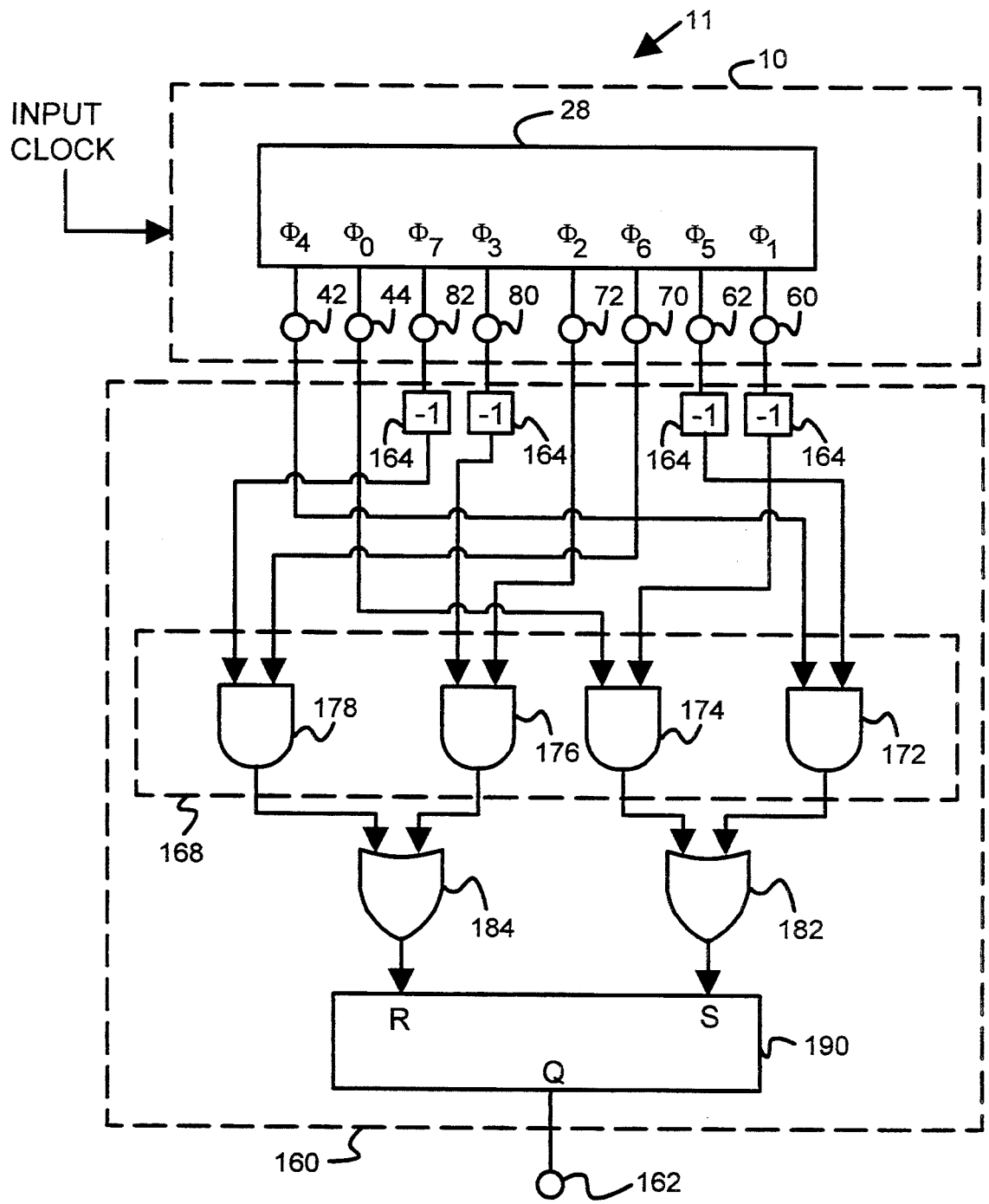
FIG. 5 shows a partially schematic, partially block diagrammatic view of a preferred embodiment of the clock multiplier of the present invention.

FIG. 5 shows a partially schematic, partially block diagrammatic view of a preferred embodiment of the clock multiplier 11 of the present invention. As shown in FIG. 5, the inventive multiplier 11 includes the phase-locked clock generator 10 of the present invention together with a conversion network 160. As is described below, the conversion network 160 is operative to combine the phase-shifted output waveforms tapped from the ring oscillator 28 into an output clock signal at a known frequency multiple of the input clock signal. In the specific embodiment of FIG. 5 the output clock waveform appearing at an output node 162 is of a frequency twice that of the multiphase clock signal.

As shown in FIG. 5, the conversion network 160 includes an array of phase inverters 164 for inverting the phase of selected signals tapped from the oscillator 28. Specifically, the inverters 164 change the phase of each of the signals appearing at the output terminals 60, 62, 80 and 82 by one hundred eighty degrees.

Each of the inverters 164 drives an input of an AND gate included within an AND gate array 168. In particular, each of the gates within the array 168 determine the logical AND of an inverted signal from the inverter 164 and a non-inverted signal from a separate output terminal of the oscillator 28. The array 168 includes a first AND gate 172 driven by the inverted signal supplied by terminal 62 and the non-inverted signal present at terminal 42. Similarly, second, third and fourth gates 174, 176 and 178 perform the AND function with regard to inverted signals from terminals 60, 80, and 82 and non-inverted signals originating at the terminals 44, 72 and 70, respectively.

As indicated in FIG. 5, the array 168 is operatively coupled to first and second inclusive-OR gates 182 and 184. The OR gates 182 and 184 are disposed to alternatively impress a logical high on the S and R inputs of an SR latch 190. The SR latch 190 includes a non-inverting output terminal Q coupled to the output terminal 162.

Figure 6:
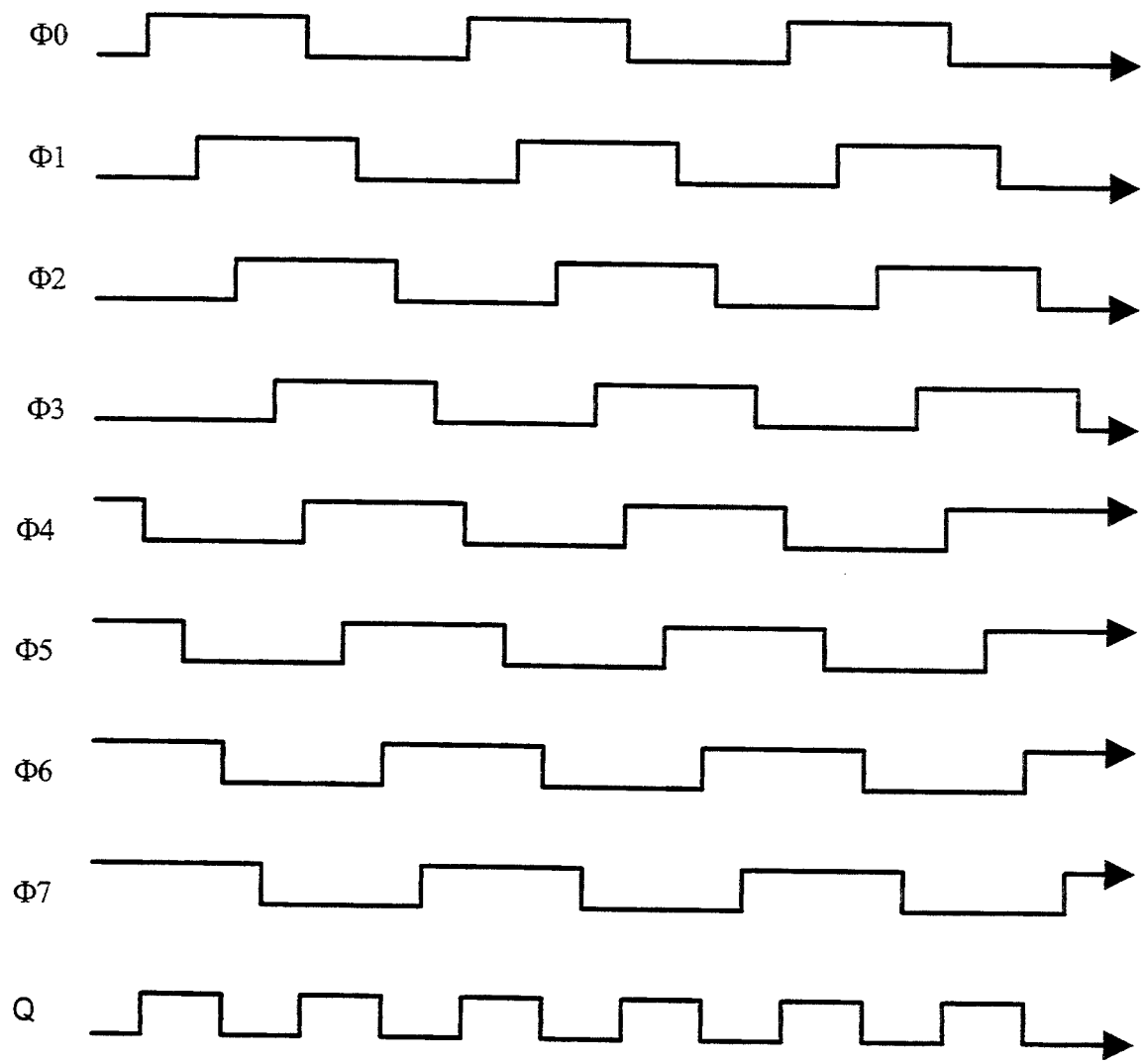
FIG. 6 is a timing diagram showing the phase relationship between the multiphase clock signals $\phi_0$, $\phi_1$, $\phi_2$, $\phi_3$, $\phi_4$, $\phi_5$, $\phi_6$, and $\phi_7$ tapped from the ring oscillator and the output clock waveform generated by the inventive clock multiplier.

FIG. 6 is a timing diagram showing the phase relationship between the multiphase clock signals $\phi_0$, $\phi_1$, $\phi_2$, $\phi_3$, $\phi_4$, $\phi_5$, $\phi_6$, and $\phi_7$ tapped from the oscillator terminals 42, 60, 72, 80, 44, 62, 70 and 86 and the output clock waveform tapped from the output node 162. As is evident upon inspection of FIGS. 5 and 6, the SR latch 190 is set and reset at a rate twice that of the frequency of the individual multiphase clock signals. Accordingly, in the presently preferred embodiment of the inventive multiplier the output clock waveform is of a frequency (e.g. 80 MHz) twice that of the multiphase clock signals and quadruple that of the input clock waveform (20 MHz).

While the present invention has been described herein with reference to a particular embodiment, it is understood that the invention is not limited thereto. The teachings of this invention may be utilized by one having ordinary skill in the art to make modifications within the scope thereof. For example, in alternative embodiments of the present invention a differing number of comparator modules may be included within the ring oscillator. Increasing the number of comparator modules serves to decrease the phase separation between the successive multiphase waveforms tapped from the ring oscillator. Similarly, with access to the teachings herein one skilled in the art may know to design differential comparators suitable to meet the disclosed objective of enhanced immunity from power supply perturbations. In addition, the inventive clock multiplication technique may be used to generate clock waveforms staggered in phase in a desired (e.g. non-overlapping) manner. Moreover, the inventive multiplier is not limited to the particular logic scheme described herein for synthesizing a multiplied clock waveform from the multiphase oscillator signals.

It is therefore contemplated by the appended claims to cover any and all such modifications.

Accordingly,

What is claimed is:

1. A multiphase clock generator comprising:
   phase detector means for generating a phase error signal in response to a phase difference between an input signal and a recovered clock signal; and
   phase-locked feedback loop means for synthesizing said recovered clock signal in response to said phase error signal, said phase-locked feedback loop means including a differential ring oscillator means for providing first and second phase-shifted output signals at first and second output ports, said differential ring oscillator means includes a first feedback path linking said first output port with a first inverting terminal and a second feedback path linking said second output port with a first non-inverting terminal, said differential ring oscillator means including first and second differential comparator modules, said first differential comparator module includes a first inverting terminal, a first non-inverting terminal, and a first control terminal held at said control voltage, said differential comparator modules having a phase delay which varies in response to a control signal, said first differential comparator module further including a first output terminal operatively connected to a first non-inverting terminal, and a second output terminal operatively connected to said first inverting terminal, the first differential comparator module including first and second input transistors, a control transistor coupled to said first and second input transistors, a first current mirror network coupled to said first input transistor, a second current mirror network coupled to said second input transistor, and third and fourth current mirror networks coupled to said first and second current mirror networks.

2. The multiphase clock generator of claim 1 wherein said phase-locked feedback loop means includes a loop filter for generating a control signal in response to said phase error signal.

3. The multiphase clock generator of claim 2 further including means for dividing the frequency of said first phase shifted output signal in order to generate said recovered clock signal.

4. The multiphase clock generator of claim 3 wherein said first differential comparator module includes a current mirror network for varying the voltage between said first and second output terminals in response to the voltage between said first inverting and first non-inverting terminals.

5. A multiphase clock generator for providing a plurality of sequentially phase-shifted output signals in response to a periodic input clock signal, comprising:
phase detector means for generating a phase error signal in response to a phase difference between an input signal and a recovered clock signal; and
phase-locked feedback loop means for synthesizing said recovered clock signal in response to said phase error signal, said phase-locked feedback loop means including a differential ring oscillator for supplying said plurality of output signals at a plurality of output terminals; said differential ring oscillator includes a plurality of serially-connected comparator modules operative to generate an output signal at an integral multiple of the frequency of said input signal, said differential ring oscillator includes inverting and non-inverting input nodes and first and second feedback paths, said first feedback path being connected between a first of said plurality of output terminals and said inverting input node and said second feedback path being connected between a second of said plurality of output terminals and said non-inverting input node, each of said differential comparator modules including a first inverting terminal, a first non-inverting terminal, and a first control terminal held at said control voltage, each of said differential comparator modules having a phase delay which varies in response to a control signal, each of said differential comparator module further including a first output terminal operatively connected to a first non-inverting terminal, and a second output terminal operatively connected to said first inverting terminal, each of the differential comparator modules including first and second input transistors, a control transistor coupled to said first and second input transistors, a first current mirror network coupled to said first input transistor, a second current mirror network coupled to said second input transistor, and third and fourth current mirror networks coupled to said first and second current mirror networks.

6. The multiphase clock generator of claim 5 further including means for dividing the frequency of said output signal.

7. A clock multiplier for multiplying the frequency of an input signal by an integer multiple, comprising:
phase-locked loop means for providing a plurality of waveforms at a first integer multiple of the frequency of said input signal, each of said waveforms being sequentially separated in phase by a first phase difference, said phase-locked loop means further includes a first feedback path linking said first output port with said first inverting terminal and a second feedback path linking said second output port with said first non-inverting terminal, said phase-locked loop means further including phase detector means for generating a phase error signal in response to the phase difference between said input clock signal and a recovered clock signal, and a phase-locked feedback network for synthesizing said recovered clock signal in response to said phase error signal, said phase-locked feedback network further including a loop filter for generating a control signal in response to said phase error signal, said phase-locked feedback network further including first and second differential comparator modules, said differential comparator modules having a phase delay which varies in response to a control signal, said first differential comparator module includes a first inverting terminal, a first non-inverting terminal, and a first control terminal held at a control voltage; said first differential comparator module includes a first output terminal operatively connected to said first non-inverting terminal, and a second output terminal operatively connected to said first inverting terminal, the first differential comparator module including first and second input transistors, a control transistor coupled to said first and second input transistors, a first current mirror network coupled to said first input transistor, a second current mirror network coupled to said second input transistor, and a third and fourth current mirror networks coupled to said first and second current mirror networks; and
means coupled to the phase locked loop means for combining said phase-shifted waveforms into an output clock signal at a second integer multiple of the frequency of said input signal.

8. The clock multiplier of claim 7 further including a frequency divider circuit in communication with said second differential comparator module.

9. The multiplier of claim 7 wherein said means for combining includes means for inverting the phase of a first set of said waveforms to create a complementary set of waveforms.

10. The clock multiplier of claim 9 wherein said means for combining further includes a multiplier array for multiplying a second set of said waveforms with said complementary set of waveforms.

11. The clock multiplier of claim 10 wherein said means for combining further includes an array of logic gates in which each of said gates is operatively coupled to a pair of said multipliers.

12. The clock multiplier of claim 11 wherein said means for combining further includes a latch circuit for supplying said output clock signal, said latch circuit being driven by said array of logic gates.

* * * * *